(12) United States Patent
Huang et al.

(10) Patent No.: US 6,722,412 B2
(45) Date of Patent: Apr. 20, 2004

(54) DIE BONDER

(75) Inventors: Yao-ting Huang, Kaohsiung (TW); Kuang-chun Chou, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/268,240

(22) Filed: Oct. 9, 2002

(65) Prior Publication Data
US 2003/0094241 A1 May 22, 2003

(30) Foreign Application Priority Data
Nov. 19, 2001 (TW) .......................................... 90128634

(51) Int. Cl.⁷ .............................................. B32B 31/00
(52) U.S. Cl. ........................ 156/499; 156/538; 156/578; 29/742
(58) Field of Search ................................ 156/499, 538, 156/539, 556, 558, 578, 580, 583.1; 29/740, 742, 759

(56) References Cited

U.S. PATENT DOCUMENTS

| | | | | |
|---|---|---|---|---|
| 5,173,338 A | * | 12/1992 | Sharp et al. ................. | 427/287 |
| 5,547,537 A | * | 8/1996 | Reynolds et al. ............ | 156/351 |
| 5,549,716 A | * | 8/1996 | Takahashi et al. .......... | 29/25.01 |
| 6,205,745 B1 | * | 3/2001 | Dudderar et al. ............. | 53/397 |
| 6,291,261 B1 | * | 9/2001 | Stark et al. .................. | 438/106 |
| 6,560,857 B1 | * | 5/2003 | Waitl et al. .................... | 29/740 |
| 6,574,857 B1 | * | 6/2003 | Pajonk et al. ................. | 29/740 |

* cited by examiner

Primary Examiner—James Sells
(74) Attorney, Agent, or Firm—Martine & Penilla, LLP

(57) ABSTRACT

A die bonder includes a conveyor, a pre-heater, at least one carrier, a paste-dispensing mechanism, a die taking/placing mechanism, and a heater. The conveyor continuously operates in a ring-shaped manner. The carrier is carried on the conveyor to position the substrate. The pre-heater heats the substrate to eliminate the moisture in the substrate. The paste-dispensing mechanism dispenses an adhesive agent onto the substrate. Then, the die taking/placing mechanism places a die onto the substrate at a position where the adhesive agent is dispensed. Finally, the heater is used to cure the adhesive agent so as to bond the die to the substrate.

13 Claims, 4 Drawing Sheets

DIE BONDER

BACKGROUND OF THE INVENTION

1. Field of the Invention

The invention relates to a die bonder and, more particularly, to a die bonder capable of keeping the substrate smooth during the die-bonding process and increasing the throughput.

2. Related Art

A die-bonding process is one of the important processes in the IC package processes. In the die-bonding process, dies that are cut from a wafer are taken out and bonded onto the substrate for follow-up processes such as wire bonding, molding and the like. With the development of the package technology and the progress of the manufacturing technology, the package structure is getting lighter, thinner, shorter, and smaller. To accommodate this trend, the die is getting larger and thinner. In addition, the substrate that is signal-connected to the die is getting thinner. For example, the currently used substrate may be a super-thin substrate having the thickness equal to or smaller than 0.26 mm.

As shown in FIG. 1, a conventional die bonder 300 includes a paste-dispensing mechanism 301, a die taking/placing mechanism (only a robot arm of which is shown) 302, and a clamping mechanism (only press bars are shown) 304. The paste-dispensing mechanism 301 is used to dispense silver paste 311 onto a substrate 303. The die taking/placing mechanism 302 takes and places dies 312 onto the substrate 303 one by one after the dispensing process of the silver paste 311 is completed. Since the substrate 303 has to be heated to remove the moisture in the substrate 303 before the die-bonding process is performed. However, after the substrate 303 is heated at a high temperature, the substrate may be warped due to the vaporization of the moisture and thermal stresses. To keep the substrate 303 smooth in the paste-dispensing and die-bonding processes, the substrate 303 may be pressed by the clamping mechanism 304 or sucked by a vacuum suction force. However, after the die-bonding process is completed, it is necessary to place the substrate 303 into an oven or use a post-heating method to cure the silver paste 311. At this time, the substrate 303 is usually separated from the clamping mechanism 304 or out of vacuum. This usually warps the substrate 303.

Since the substrate becomes wrapped during the die-bonding process, even though the substrate is smoothened by the clamping mechanism or the vacuum suction force during the paste-dispensing and die-bonding processes, the substrate still tends to return to the wrapped state after the clamping force or the suction force is removed. Therefore, the phenomenon of shrinkage of the silver paste occurs and voids are formed to decrease the reliability of the products.

Furthermore, since the silver paste has to be cured after the die-bonding process is completed, the substrate on which dies are bonded has to be placed into a substrate magazine that is then transferred to the oven for heating. Alternatively, the substrate may be heated directly on the track by way of post-heating to cure the silver paste. However, whether the silver paste is cured by the oven or by the post-heating method, the substrate has to be held up for a period of time according to the operation of the oven or the machine. This results in a time delay and thus decreases the throughput.

Therefore, it is an important subject matter to keep the substrate smooth, to prevent the substrate from being wrapped under the heating process, and to shorten the whole time for the die-bonding process.

SUMMARY OF THE INVENTION

In view of the above-mentioned subject matter, it is therefore an object of the invention to provide a die bonder capable of preventing the substrate from being wrapped during the die-bonding process.

Also, another object of the invention is to provide a die bonder capable of speeding up the die-bonding process.

In this invention, a heat-resistant carrier is used to continuously position the substrate so that the substrate can be kept smooth during the whole die-bonding process and warpage of the substrate can be avoided. In addition, the invention also utilizes a circulating conveyor to perform the sequential dispensing process, die-bonding process, and curing process, so as to improve the speed of the die-bonding process and the throughput.

Thus, in order to achieve the above-mentioned objects, the invention provides a die bonder including a conveyor, a pre-heater, at least one carrier, a paste-dispensing mechanism, a die taking/placing mechanism, and a heater. The conveyor continuously operates in a ring-shaped manner. The carrier is carried on the conveyor to position the substrate. The pre-heater heats the substrate. The paste-dispensing mechanism dispenses an adhesive agent onto the substrate. Then, the die taking/placing mechanism places a die onto the substrate at a position where the adhesive agent is dispensed. Finally, the heater is used to cure the adhesive agent so as to bond the die to the substrate.

Since the heat-resistant carrier is used to carry the substrate in the die bonder of the invention and is capable of keeping the substrate smooth, even though the substrate is heated to eliminate the moisture before the die-bonding process, the substrate is not wrapped during the heating process by the vaporization of the moisture and the generation of thermal stresses. Thus, the voids generated due to the shrinkage of the silver paste dispensed on the substrate can be avoided. In addition, the yield of the products is increased. Moreover, the conveyor further conveys the carrier to perform a series of dispensing, die-bonding, and curing processes. During the curing process of the silver paste, since the substrate is positioned on the carrier, the silver paste dispensed on the substrate can be continuously cured. In other words, during the curing process, the substrate does not have to be held up to cure the silver paste. Thus, the curing time is shortened, and the throughput of the products is increased.

DETAILED DESCRIPTION OF THE PREFERRED EMBODIMENTS

The die bonder in accordance with the preferred embodiments of the invention will be described in detail with reference to the accompanying drawings.

Figure 1:
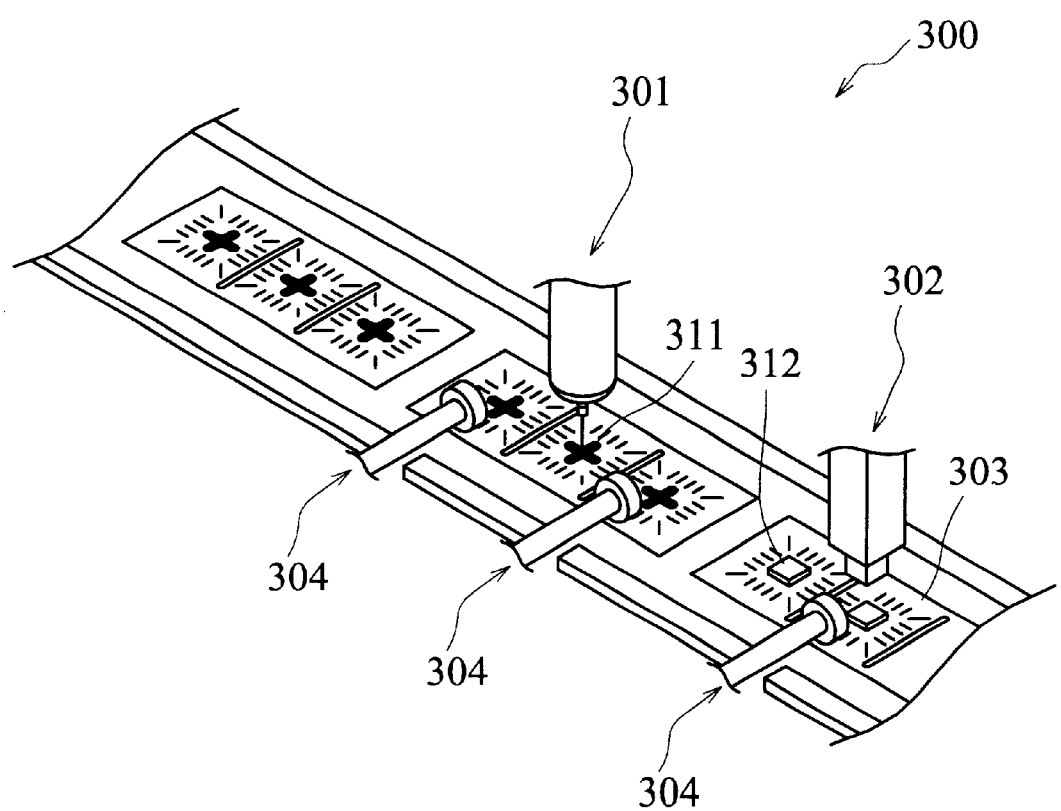
FIG. 1 is a schematic illustration showing a substrate clamped by a conventional clamping mechanism for performing a dispensing process and a die-bonding process.
Figure 2:
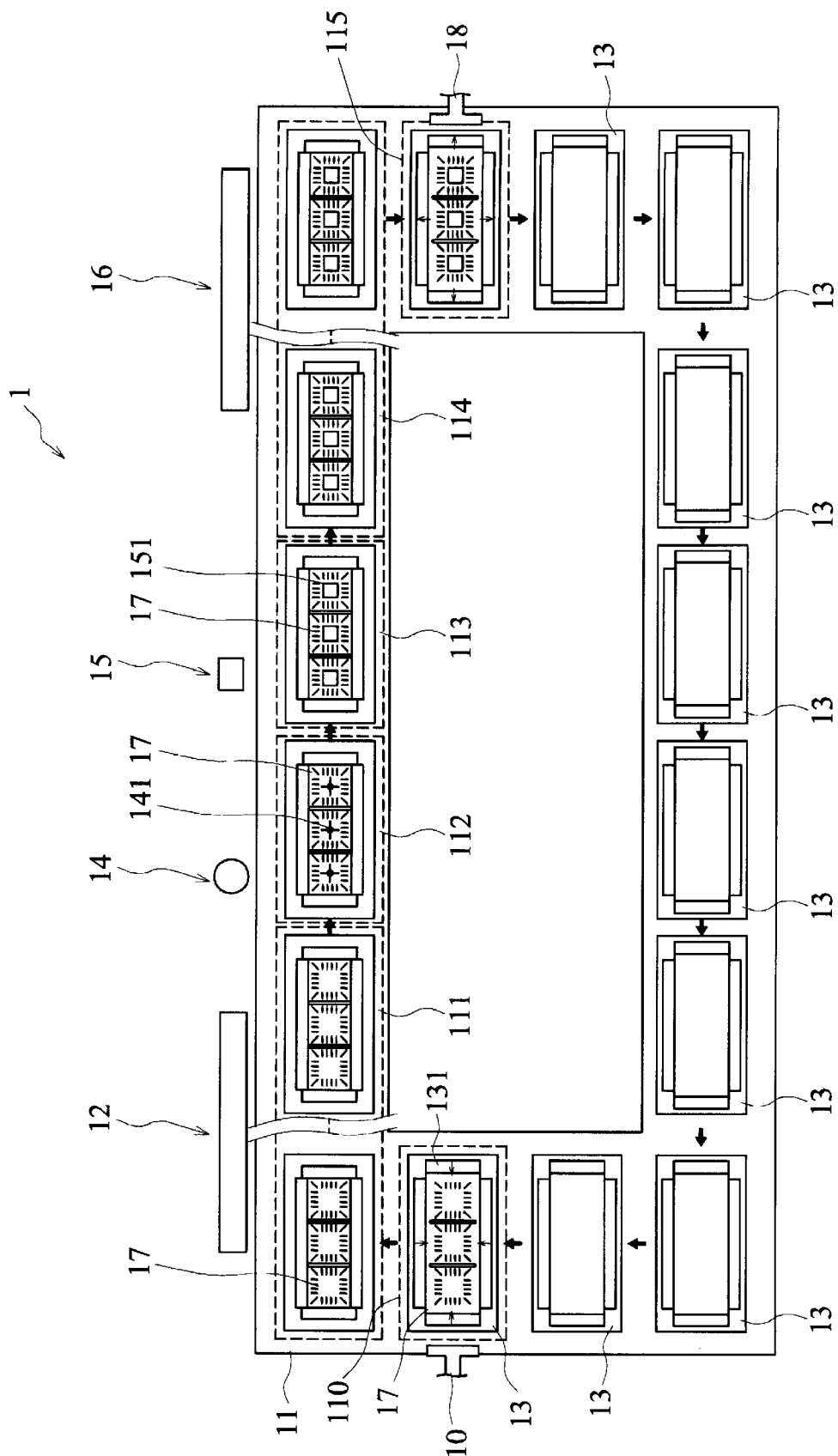
FIG. 2 is a schematic illustration showing a circulating operation of the die bonders along a horizontal direction in accordance with a preferred embodiment of the invention.

As shown in FIG. 2, the die bonder 1 in accordance with a preferred embodiment of the invention includes a conveyor 11, a pre-heater 12, at least one carrier 13, a paste-dispensing mechanism 14, a die taking/placing mechanism 15 and a heater 16. Substrates 17 can be positioned on the carriers 13 that are conveyed by the conveyor 11. The substrates are pre-heated by the pre-heater 12. The paste-dispensing mechanism 14 dispenses an adhesive agent, such as silver paste 141, on the substrates. Then, the die taking/placing mechanism 15 places the dies 151 onto the substrates 17 at positions with the silver paste 141. Next, the heater 16 is used to cure the silver paste 141 so that the each die 151 can be electrically connected to its corresponding substrate 17. It should be mentioned that the pre-heater 12, the paste-dispensing mechanism 14, the die taking/placing mechanism 15, and the heater 16 are actually located above the conveyor 11. However, for the sake of convenience, they are drawn to be located at one side of the conveyor 11.

Figure 3:
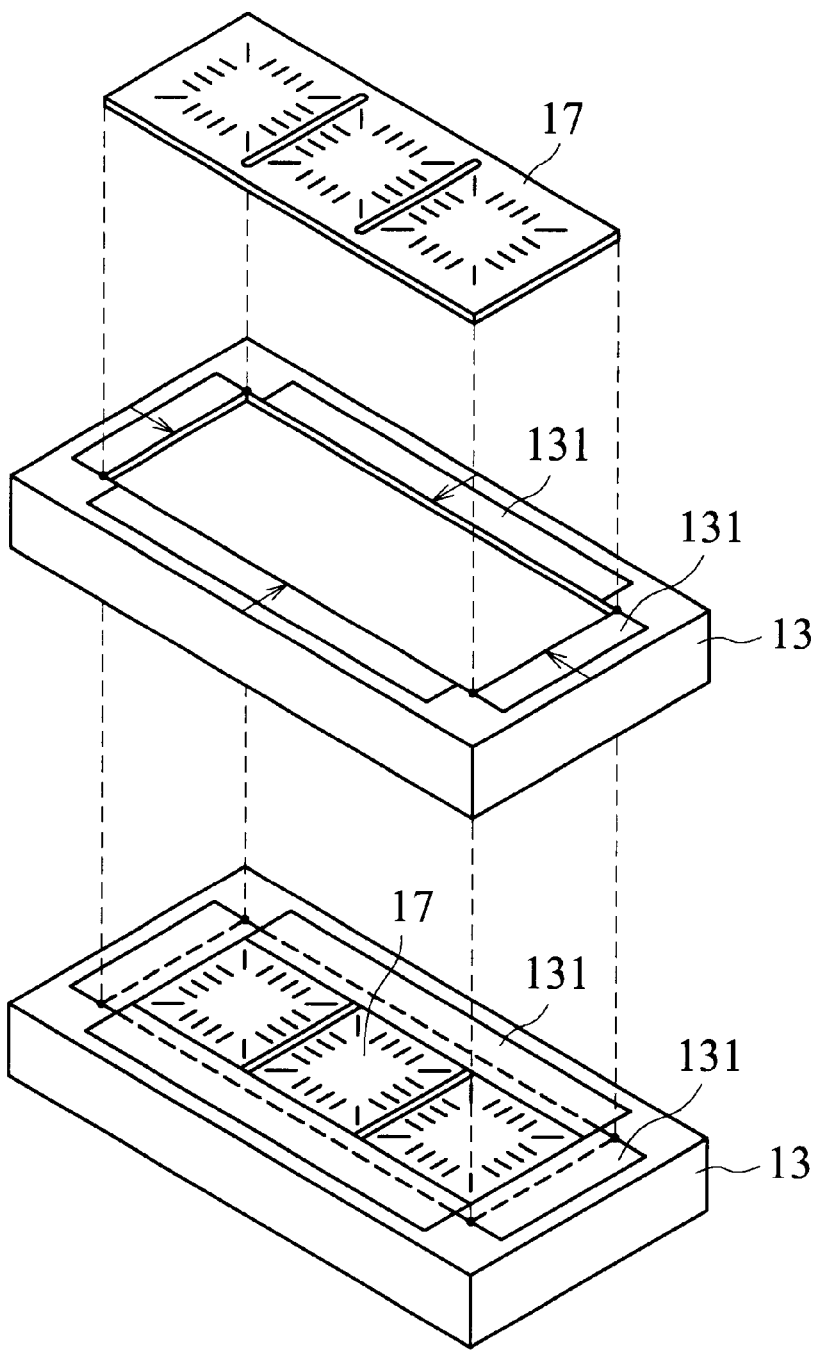
FIG. 3 is a pictorial view showing a substrate clamped by a carrier.

As shown in FIG. 3, four pressers 131 are provided on four sides of the carrier 13, respectively. After the substrate 17 is placed onto the carrier 13, the pressers 131 are moved along the directions shown by arrows so as to clamp the substrate 17 by the pressers 131. In addition, the carrier 13 may also be formed with a plurality of suction holes for providing a vacuum suction force to position the substrate 17 on the carrier 13. The carrier 13 may be made of high temperature-resistant material, such as epoxy resin, polyurethane, polyimide or the like, so that the carrier 13 can bear the high-temperature heating process.

Referring to FIG. 2 again, on the preparation site 110 of the conveyor 11, the substrate robot 10 places the substrate 17 on the carrier 13, and the pressers 131 are moved to clamp the substrate 17 on the carrier 13. The conveyor 11 includes a linear track or a plurality of rollers so that the conveyor 11 can circulate along a horizontal direction, that is, the conveyor 11 can circulate along the arrow direction as shown in FIG. 2.

In the embodiment, in the preparation site 110, the substrates 17 are placed on the carrier 13 and are then conveyed to a pre-heating site 111 by the conveyor 11. A number of carriers 13 can be placed in the pre-heating site 111. Also, the substrates 17 on the carriers 13 are conveyed by the conveyor 11 while pre-heated by the pre-heater 12 so as to eliminate the moisture in the substrate 17 and heat and convey the substrate 17 simultaneously. Since the substrates 17 are clamped by the carriers 13, even though the substrates 17 are heated under a high temperature, the surfaces thereof still can be kept smooth. Thus, the substrates 17 are not wrapped and need not to be stopped for performing the heating process.

After the substrate 17 is heated in the pre-heating site 111, it is conveyed into the paste-dispensing site 112. In this site, the carrier 13 still positions the substrate 17, i.e., the four pressers 131 clamps the substrate 17 at four sides of the carrier 13. The paste-dispensing mechanism 14 dispenses the silver paste 141 or other adhesive agents at regions where dies are to be placed on the substrate 17. After the silver paste 141 is dispensed, the substrate 17 is conveyed into the die-bonding site 113. In this site, the substrate 17 is still placed on the carrier 13 and is conveyed by the conveyor 11. Therefore, the die taking/placing mechanism 15 may place the dies 151 that are cut, one by one, on the substrate 17 at locations where silver paste 141 are dispensed.

After the die-bonding process is finished, the substrate 17 is conveyed into the curing site 114 where the heater 16 is used to cure the silver paste 141 so that the dies 151 can be closely bonded to the substrate 17. In the curing site 114, a plurality of carriers 13 on which the substrates 17 are placed are conveyed by the conveyor 11. Since the substrates 17 can be sequentially moved as well as cured by the heater 16, the substrates 17 can be heated while they are moved. Accordingly, the manufacturing processes can be speeded up, and the throughput can also be improved.

After the curing process is finished, the substrate 17 is conveyed into a substrate-exporting site 115. In this site, the pressers 131 that clamps the substrate 17 at four sides of the carrier 13 are removed so that a puller 18 takes the substrate 17 out of the carrier 13.

Next, the carrier 13 without the substrate 17 is conveyed by the conveyor 11 and circulated along the horizontal direction in a ring-shaped manner so that the carrier 13 can be repeatedly used. When the carrier 13 returns to the preparation site 110, another substrate 17 is placed on the carrier 13 by the substrate robot 10, and then the substrate 17 is conveyed into the pre-heating site 111, the paste-dispensing site 112, the die-bonding site 113, the curing site 114, and the substrate-exporting site 115 for the repeated pre-heating, dispensing, die-bonding, and curing processes.

Figure 4:
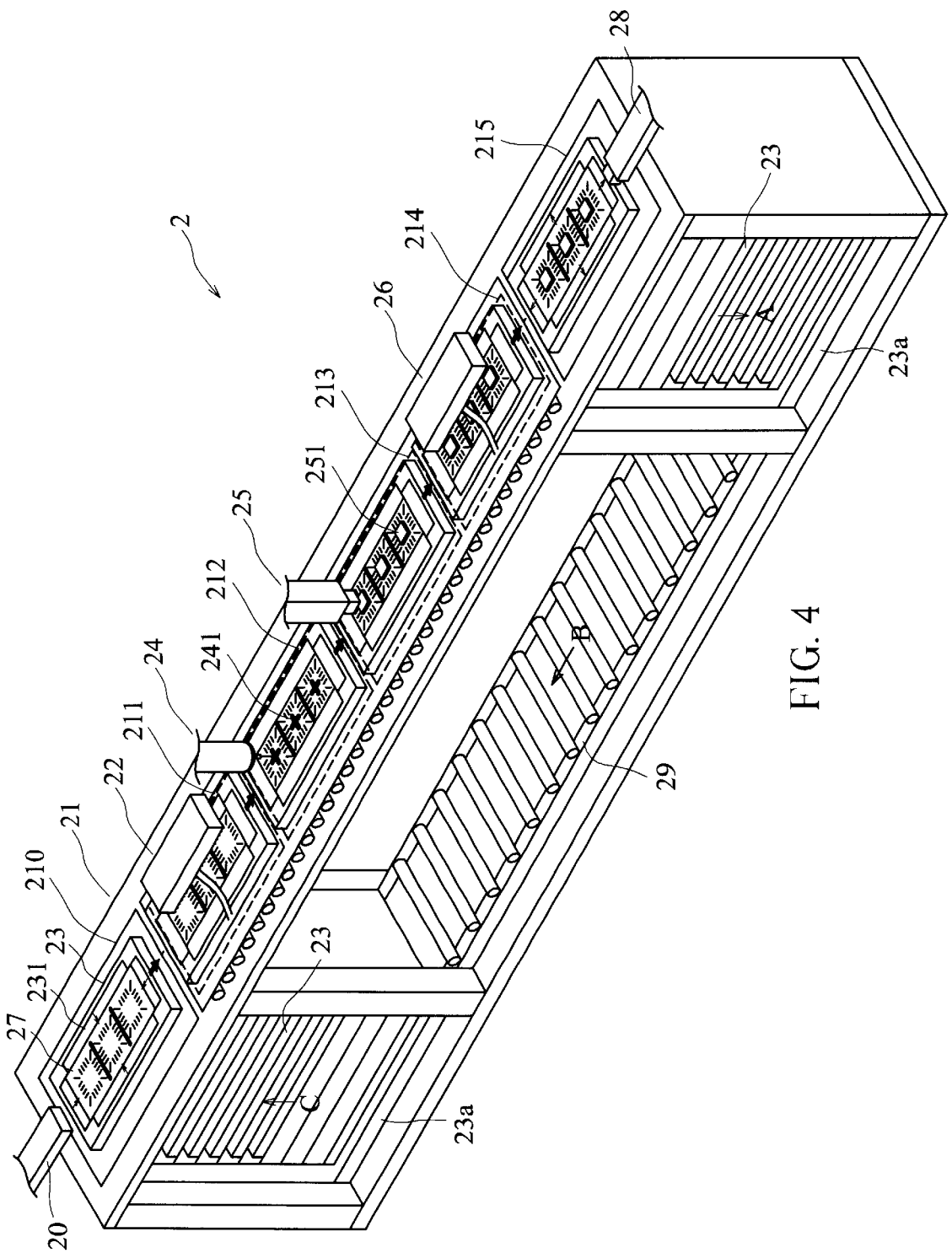
FIG. 4 is a schematic illustration showing a circulating operation of the die bonders along a vertical direction in accordance with another preferred embodiment of the invention.

FIG. 4 shows another embodiment of the invention. A die bonder 2 of the preferred embodiment of the invention mainly includes a conveyor 21, a pre-heater 22, a plurality of carriers 23, a paste-dispensing mechanism 24, a die taking/placing mechanism 25, and a heater 26.

In this embodiment, the conveyor 21 circulates along a vertical direction. The conveyor 21 has a carrier magazine 23a to store carriers 23. The carrier magazine 23a is operated in conjunction with an elevator (not shown) so as to move the carriers 23 up and down. When the carrier 23 is moved to the preparation site 210, the substrate robot 20 places the substrate 27 onto the carrier 23, and the pressers 231 are moved to clamp the substrate 27. Then, the carrier 23 is conveyed into the pre-heating site 211. At this time, the pre-heater 22 heats the substrate 27 to eliminate the moisture in the substrate 27. Next, the carrier 23 is conveyed into the paste-dispensing site 212 where silver paste 241 is dispensed on the substrate 27 by the paste-dispensing mechanism 24. Then, the carrier 23 is conveyed into the die-bonding site 213 where dies 251 are attached by the die taking/placing mechanism 25. After the die-bonding process is finished, the substrate 27 has to be heated to cure the silver paste 241 that is dispensed before, so that the dies 251 can be closely bonded to the substrate 27. It should be noted that a number of carriers 23 with substrates 27 are heated in the pre-heating site 211 and curing site 214. Thus, the substrate 27 can be heated and conveyed by the conveyor 21 simultaneously without interrupting the time for heating.

After the heating process is finished, the carrier 23 is conveyed into the substrate-exporting site 215 where the puller 28 removes the substrate 27 from the carrier 23.

In this embodiment, after the substrate 27 is removed, the carrier 23 is downwardly transferred into the carrier magazine 23a along the direction of the arrow A and is stored. When the carrier magazine 23a is full with carriers 23, a shifter 29 transfers the carrier magazine 23a along the direction of the arrow B to a location under the preparation site 210. As described above, the elevator operates in conjunction with the carrier magazine 23a so that the carriers 23 can be upwardly moved out of the carrier magazine 23a along the direction of the arrow C, and then return to the preparation site 210. Thus, the carrier 23 can be circulated along the vertical direction by the conveyor 21 and can be used repeatedly.

The die bonder of the invention uses the heat-resistant carrier to carry the substrate and the carrier is capable of keeping the substrate smooth, even though the substrate is heated to eliminate the moisture before the die-bonding process. Therefore, the substrate is not wrapped during the heating process by the vaporization of the moisture and the generation of thermal stresses. Thus, the voids generated due to the shrinkage of the silver paste dispensed on the substrate can be avoided. In addition, the decreased yield of the products can also be avoided. Moreover, the carrier is conveyed by a conveyor to perform a series of pre-heating, dispensing, die-bonding, and curing processes. In particular, during the pre-heating and curing processes of the silver paste, since the substrates are smoothly placed on the carriers that are conveyed by the conveyor, the silver paste dispensed on the substrate can be continuously heated. That is, the substrate does not have to be held up to cure the silver paste. Thus, the heating time is shortened, and the throughput of the products is increased.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A die bonder for bonding a die to a substrate, comprising:

a conveyor continuously operating in a ring-shaped manner;

at least one carrier carried on the conveyor for positioning the substrate;

a paste-dispensing mechanism for dispensing an adhesive agent on the substrate; and a die taking/placing mechanism for placing a die on the substrate at a position where the adhesive agent is dispensed.

2. The die bonder according to claim 1, further comprising:

a pre-heating mechanism for heating the substrate before the adhesive agent is dispensed.

3. The die bonder according to claim 1, further comprising:

a heater for curing the adhesive agent so as to bond the die to the substrate.

4. The die bonder according to claim 1, wherein the conveyor comprises a linear track.

5. The die bonder according to claim 1, wherein the conveyor comprises a plurality of rollers.

6. The die bonder according to claim 1, wherein the conveyor circulates along a horizontal direction.

7. The die bonder according to claim 1, wherein the conveyor circulates along a vertical direction.

8. The die bonder according to claim 1, wherein the carrier comprises a plurality of pressers arranged on the carrier, the substrate is pressed and clamped by the pressers so that the substrate can be positioned on the carrier.

9. The die bonder according to claim 1, wherein the carrier is formed with a plurality of suction holes for providing a vacuum suction force so as to position the substrate on the carrier.

10. The die bonder according to claim 1, wherein the carrier is formed by a heat-resistant material.

11. The die bonder according to claim 1, further comprising:

a substrate robot for placing the substrate onto the carrier.

12. The die bonder according to claim 1, further comprising:

a puller for taking out the substrate from the carrier.

13. The die bonder according to claim 1, wherein the conveyor comprises:

a carrier magazine for storing the at least one carrier;

a elevator for moving the carrier magazine up and down; and a shifter for transferring the carrier magazine.

* * * * *